US006962644B2

(12) United States Patent
Paterson et al.

(10) Patent No.: US 6,962,644 B2
(45) Date of Patent: Nov. 8, 2005

(54) TANDEM ETCH CHAMBER PLASMA PROCESSING SYSTEM

(75) Inventors: Alexander Paterson, San Jose, CA (US); Valentin N. Todorov, Fremont, CA (US); Jon McChesney, San Ramon, CA (US); Gerhard M. Schneider, Cupertino, CA (US); David Palagashvili, Mountain View, CA (US); John P. Holland, San Jose, CA (US); Michael S. Barnes, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 240 days.

(21) Appl. No.: 10/241,653

(22) Filed: Sep. 10, 2002

(65) Prior Publication Data

US 2003/0176074 A1 Sep. 18, 2003

Related U.S. Application Data

(60) Provisional application No. 60/364,782, filed on Mar. 18, 2002.

(51) Int. Cl.[7] .................. C23F 1/00; H01L 21/306; C23C 16/00
(52) U.S. Cl. .................. 156/345.28; 156/345.24; 156/345.31; 156/345.32; 156/345.48; 118/719; 118/723 I
(58) Field of Search ............. 156/345.31, 345.28, 156/345.32; 118/719; 438/689, 710, 716

(56) References Cited

U.S. PATENT DOCUMENTS

| 3,291,715 A | 12/1966 | Anderson .......... 204/298 |
| 4,341,582 A | 7/1982 | Kohman et al. ........ 156/345 |
| 4,431,898 A | 2/1984 | Reinberg et al. ........ 219/121 |
| 4,482,419 A | 11/1984 | Tsukada et al. ........ 156/345 |
| 4,963,242 A | 10/1990 | Sato et al. .......... 204/298.31 |
| 5,215,619 A | 6/1993 | Cheng et al. ........ 156/345 |
| 5,225,024 A | 7/1993 | Hanley et al. ........ 156/345 |
| 5,444,207 A | 8/1995 | Sekine et al. ........ 219/121.43 |
| 5,449,977 A | 9/1995 | Nakagawa et al. ........ 315/111.51 |
| 5,534,108 A | 7/1996 | Qian et al. ........ 156/643.1 |

(Continued)

FOREIGN PATENT DOCUMENTS

WO    WO 02/38841 A2    5/2002    .......... C30B/31/00

OTHER PUBLICATIONS

PCT International Search Report Dated Oct. 27, 2003, For International Application No. PCT/US 03/06716, International Filing Date Mar. 5, 2003, For Applicant Applied Materials, Inc.

*Primary Examiner*—Parviz Hassanzadeh
*Assistant Examiner*—Karla Moore
(74) *Attorney, Agent, or Firm*—Moser, Patterson & Sheridan, LLP

(57) ABSTRACT

A method and apparatus for processing wafers including a chamber defining a plurality of isolated processing regions. The isolated processing regions have an upper end and a lower end. The chamber further includes a plurality of plasma generation devices each disposed adjacent the upper end of each isolated processing region, and one of a plurality of power supplies connected to each plasma generation device. The output frequency of the plurality of power supplies are phase and/or frequency locked together. Additionally, the chamber includes a plurality of gas distribution assemblies. Each gas distribution assembly is disposed within each isolated processing region. A movable wafer support is disposed within each isolated processing region to support a wafer for plasma processing thereon. The movable wafer support includes a bias electrode coupled to a bias power supply configured to control the bombardment of plasma ions toward the movable wafer support.

35 Claims, 13 Drawing Sheets

U.S. PATENT DOCUMENTS

| | | | |
|---|---|---|---|
| 5,674,321 A | 10/1997 | Pu et al. | 118/723 |
| 5,855,681 A | 1/1999 | Maydan et al. | 118/719 |
| 5,877,090 A | 3/1999 | Padmapani et al. | 438/714 |
| 5,928,963 A * | 7/1999 | Koshiishi | 438/714 |
| 5,998,933 A | 12/1999 | Shun'ko | 315/111.51 |
| 6,048,601 A | 4/2000 | Yahagi et al. | 428/147 |
| 6,113,731 A | 9/2000 | Shan et al. | 156/345 |
| 6,152,070 A * | 11/2000 | Fairbairn et al. | 118/719 |
| 6,212,928 B1 | 4/2001 | Kim et al. | 72/202 |
| 6,223,755 B1 * | 5/2001 | Smith et al. | 134/1.1 |
| 6,228,208 B1 | 5/2001 | Lill et al. | 156/345 |
| 6,265,723 B1 | 7/2001 | Morita | 250/515.1 |

\* cited by examiner

TANDEM ETCH CHAMBER PLASMA PROCESSING SYSTEM

CROSS-REFERENCE TO A RELATED APPLICATION

This invention is based on U.S. Provisional Patent Application Ser. No. 60/364,782 filed Mar. 18, 2002, entitled "Producer-E RF Source And Bias Electrode Development", filed in the name of Paterson et. al. The priority of this provisional application is hereby claimed.

BACKGROUND OF THE INVENTION

1. Field of the Invention

Embodiments of the invention generally relate to semiconductor wafer processing, and more particularly, to etch and plasma related semiconductor wafer manufacturing processes and related hardware.

2. Description of the Related Art

A chip manufacturing facility is composed of a broad spectrum of technologies. Cassettes containing semiconductor wafers are routed to various stations in a facility where they are either processed or inspected. Semiconductor processing generally involves the deposition of material onto and removal ("etching") of material from wafers. Typical processes include chemical vapor deposition (CVD), physical vapor deposition (PVD), electroplating, chemical mechanical planarization (CMP), etching, and others.

One concern regarding wafer processing is wafer throughput. Generally, the greater the wafer throughput, the lower the manufacturing cost and therefore the lower the cost of the processed wafers. In order to increase wafer processing throughput, conventional batch processing chambers have been developed. Batch processing allows several wafers to be processed simultaneously using common fluids, such as process gases, chambers, processes, and the like, thereby decreasing equipment costs and increasing throughput. Ideally, batch-processing systems expose each of the wafers to an identical process environment whereby each wafer simultaneously receives the same process gases and plasma densities for uniform processing of the batch. Unfortunately, the processing within batch processing systems is hard to control such that uniform processing occurs with respect to every wafer. Consequently, batch processing systems are notorious for non-uniform processing of wafers. To achieve better process control, single chamber wafer processing systems were developed to conduct wafer processing on a single wafer in a one-at-a-time-type fashion within an isolated process environment. Unfortunately, single chamber wafer processing systems generally are not able to provide as high a throughput rate as batch processing systems, as each wafer must be sequentially processed.

Therefore, there is a need for a wafer processing system configured to provide controllable etch uniformity of a single wafer system and improved throughput characteristics of a batch processing system.

SUMMARY OF THE INVENTION

Embodiments of the invention generally provide a wafer plasma processing system configured to provide concurrent transfer of at least two wafers through the processing system simultaneously. In one embodiment, the invention provides a method and apparatus for processing wafers including a chamber defining a plurality of isolated processing regions. The isolated processing regions have an upper end and a lower end. The chamber further includes a plurality of plasma generation devices each disposed adjacent the upper end of each isolated processing region, and one of a plurality of RF power supplies connected to each plasma generation device. The output signal of the plurality of RF power supplies are frequency and/or phase locked to one another. Additionally, the chamber includes a plurality of gas distribution assemblies. Each gas distribution assembly disposed within each isolated processing region. A movable wafer support is disposed within each isolated processing region to support a wafer for plasma processing thereon. The movable wafer support includes a bias electrode coupled to a bias power supply configured to control the plasma ions proximate the movable wafer support.

BRIEF DESCRIPTION OF THE DRAWINGS

So that the manner in which the above recited features of the invention are attained can be understood in detail, a more particular description of the invention, briefly summarized above, may be had by reference to the embodiments thereof, which are illustrated in the appended drawings. It is to be noted, however, that the appended drawings illustrate only typical embodiments of this invention, and are therefore, not to be considered limiting of its scope, for the invention may admit to other equally effective embodiments.

DETAILED DESCRIPTION

Embodiments of the invention generally provide a plasma processing system adapted to concurrently process multiple wafers. The wafer processing system combines the advantages of single wafer process chambers and multiple wafer handling for high quality wafer processing, high wafer throughput and a reduced system footprint.

Figure 1:
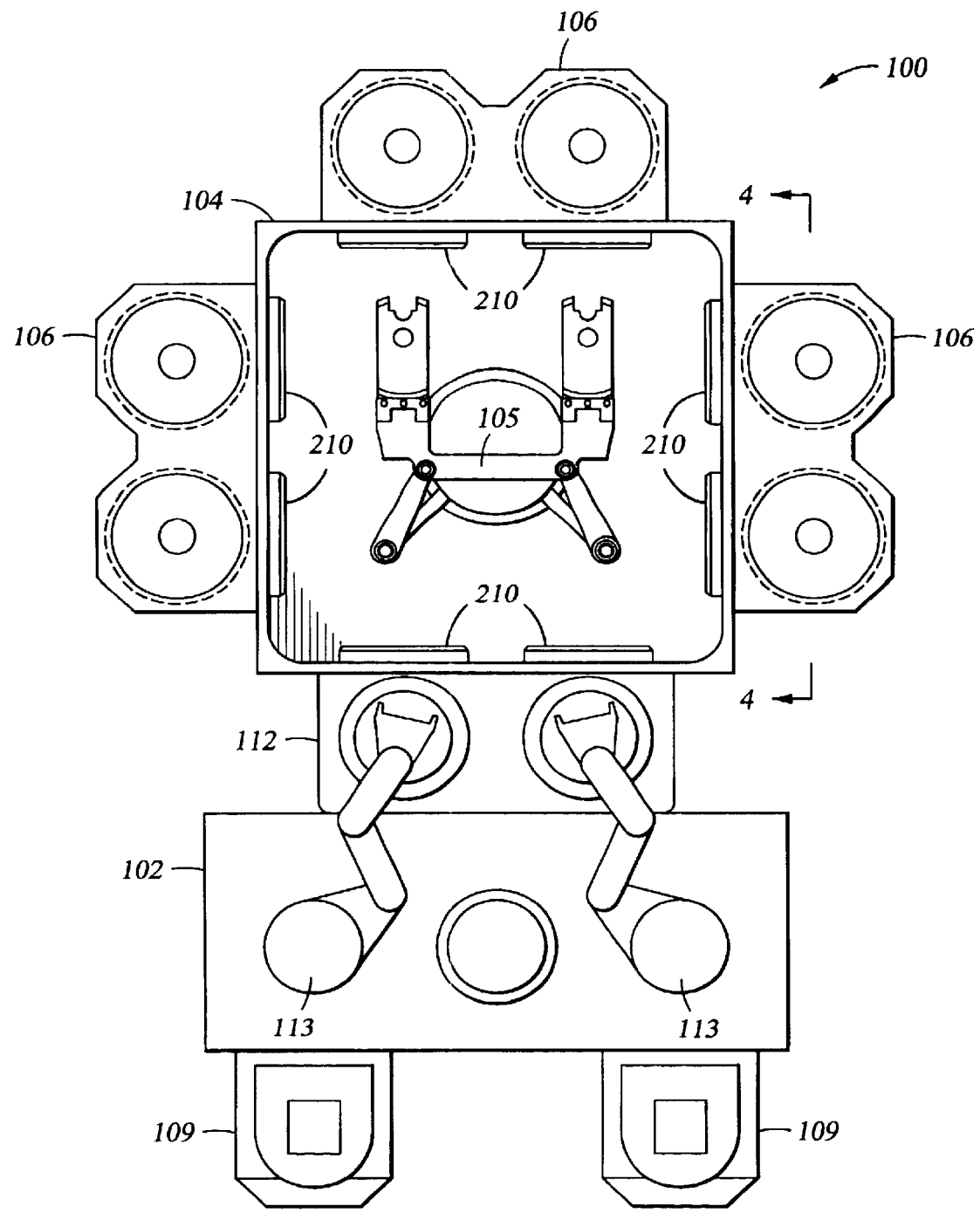
FIG. 1 is a plan-view of one embodiment of a semiconductor tandem etch processing system.
Figure 2:
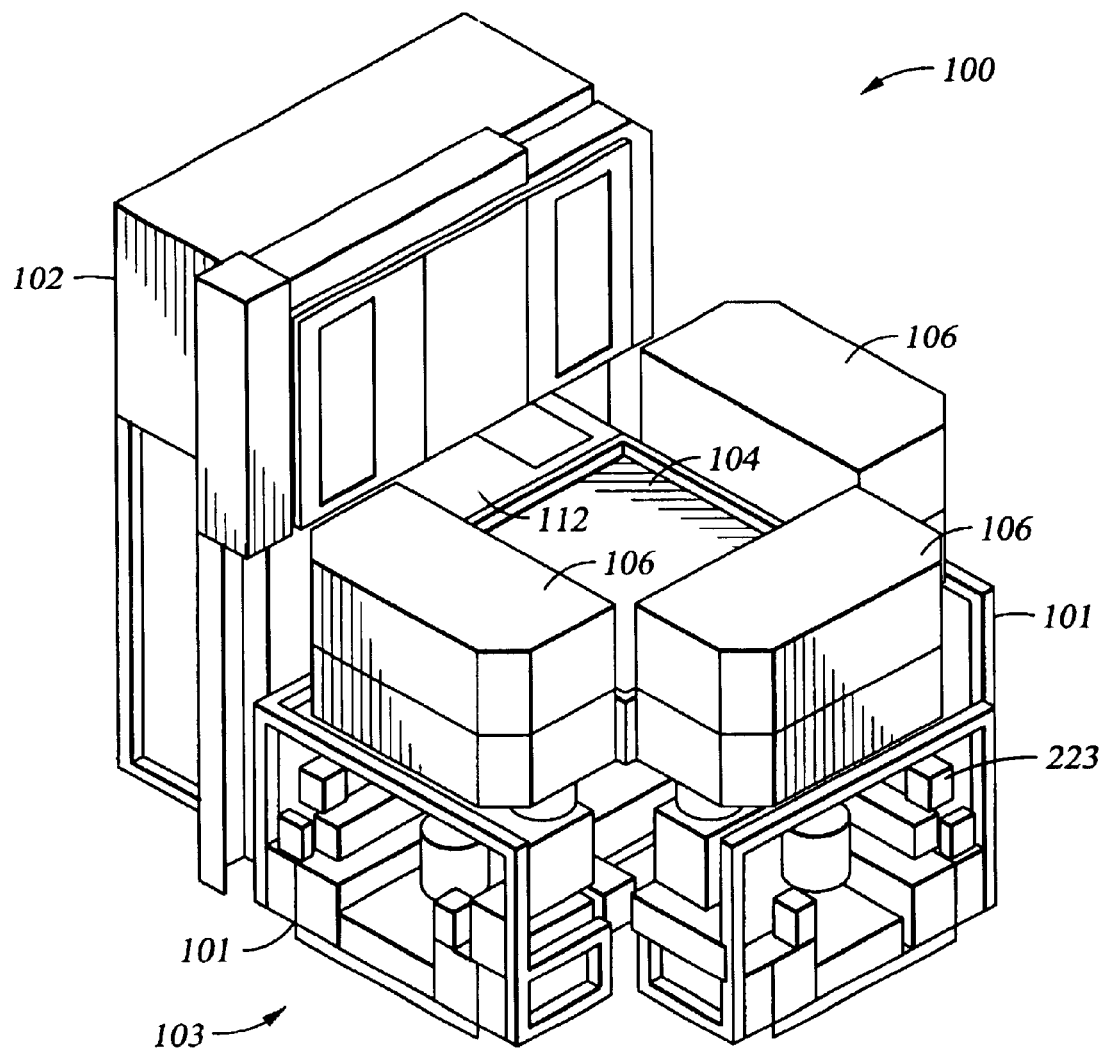
FIG. 2 is a perspective view of the semiconductor tandem etch processing system of FIG. 1.

FIGS. 1 and 2 respectively illustrate a plan view and perspective view of an exemplary tandem chamber-type etch system 100 of the invention. The system 100 is generally a self-contained system having the necessary processing utilities supported on a mainframe structure 101 that can be easily installed and provides a quick start up for operation. System 100 generally includes four different regions, namely, a front-end staging area 102, a loadlock chamber 112, and a transfer chamber 104 in communication with a plurality of tandem processing chambers 106 through isolation valves 210. Front-end staging area 102, which is generally known as a factory interface or mini environment, generally includes an enclosure having at least one wafer containing cassette 109 positioned in communication therewith via a pod loader, for example. The system 100 may also include a pair of front-end wafer transfer robots 113, which may generally be single-arm robots configured to move wafers between the front-end staging area 102 and the loadlock chamber 112. The pair of front-end wafer transfer robots 113 are generally positioned proximate cassettes 109 and are configured to remove wafers therefrom for processing, as well as position wafers therein once processing of the wafers is complete. Although two cassettes 109 are shown, the invention is not limited to any particular number of cassettes 109. For example, embodiments of the invention contemplate using a stackable wafer cassette feeder assembly (not shown). The stackable wafer feeder assembly may be configured to store a plurality of cassettes 109 in a vertical stack and individually deliver the cassettes 109 to outer cassette locations/pod loaders when needed. The front-end staging area 102 is selectively in communication with the load lock chamber 112 through, for example, a selectively actuated valve (not shown). Additionally, loadlock 112 may also be selectively in communication with the transfer chamber 104 via another selectively actuated valve, for example. Therefore, the loadlock chamber 112 may operate to isolate the interior of the wafer transfer chamber 104 from the interior of the front-end enclosure 102 during the process of transferring one or more wafers into the transfer chamber 104 for processing. The loadlock chamber 112 may be a side-by-side wafer type chamber, a single wafer type chamber, or multi-wafer-type loadlock chamber, for example, as is generally known in the art.

As illustrated in FIG. 1, a wafer transfer robot 105 may be centrally positioned in the interior portion of the transfer chamber 104. The wafer transfer robot 105 is generally configured to receive wafers from the loadlock chamber 112 and transport the wafers received therefrom to one of the tandem processing chambers 106 positioned about the perimeter of the transfer chamber 104. Additionally, the wafer transfer robot 105 is generally configured to transport wafers between the respective tandem processing chambers 106, as well as from the tandem processing chambers 106 back into the loadlock chamber 112. The wafer transfer robot 105 generally includes a single dual-blade configured to support two wafers thereon simultaneously. The blade may include two support surfaces generally aligned in a single plane to hold the wafers thereon. Additionally, the blade of the wafer transfer robot 105 is selectively extendable, while the base is rotatable, which may allow the blade access to the interior portion of any of the tandem processing chambers 106, the loadlock chamber 112, and/or any other chamber positioned around the perimeter of the transfer chamber 104.

Figure 3:
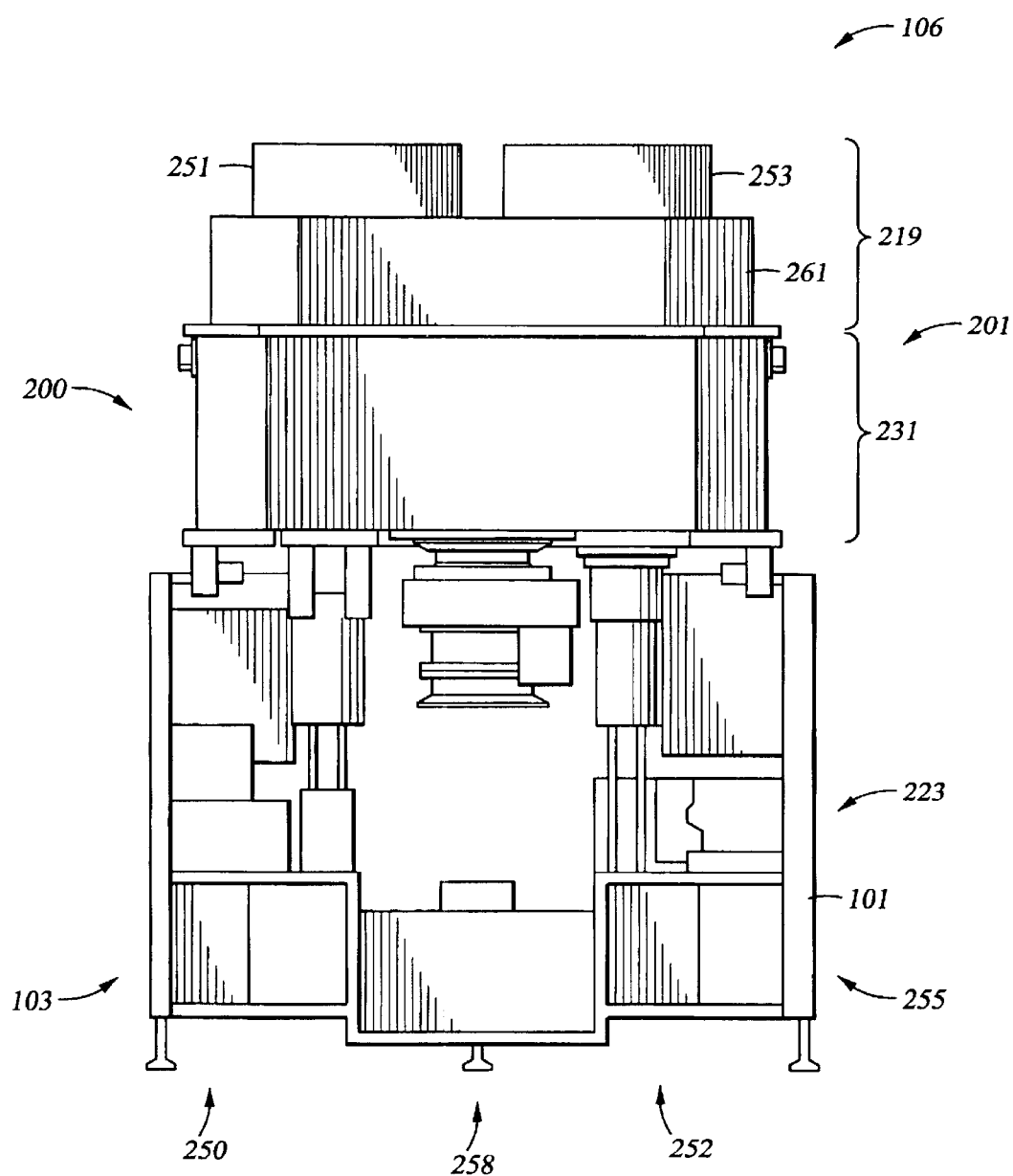
FIG. 3 is a perspective view of one embodiment of a tandem etch chamber.

As illustrated in FIGS. 2 and 3, the system 100 includes a utility supply unit 103, which may be positioned in any location that is generally proximate system 100. However, to maintain a smaller footprint, the utility supply unit 103 may be disposed below the loadlock chamber 112. The utility supply unit 103 generally houses the support utilities needed for operation of system 100, such as a gas panel, a power distribution panel, power generators, and other components used to support semiconductor etch processes. The utility supply unit 103 generally includes RF power, bias power, and electrostatic power sections for each tandem processing chamber 106. For ease of servicing the processing chambers 106 from below, the utility supply unit 103 may have a removable portion 258 slidably mounted to main frame structure 101.

The system 100 may include a process controller 223 in order to control one or more wafer processing functions. In one embodiment of the invention, the process controller 223 includes a computer or other controller adapted to analyze and display data input/output signals of the system 100, and may display the data on an output device such as a computer monitor screen. In general, the process controller 223 includes a controller, such as programmable logic controller (PLC), computer, or other microprocessor-based controller. The process controller 223 may include a central processing unit (CPU) in electrical communication with a memory, wherein the memory contains a wafer processing program that, when executed by the CPU, provides control for at least a portion of the system 100. The wafer processing program may conform to any one of a number of different programming languages. For example, the program code can be written in PLC code (e.g., ladder logic), object oriented program code such as C, C++, Java, or a number of other languages. As such, the process controller 223 may receive inputs from the various components of the system 100 and generate control signals that may be transmitted to the respective components of the system 100 for controlling the operation thereof.

Figure 4A:
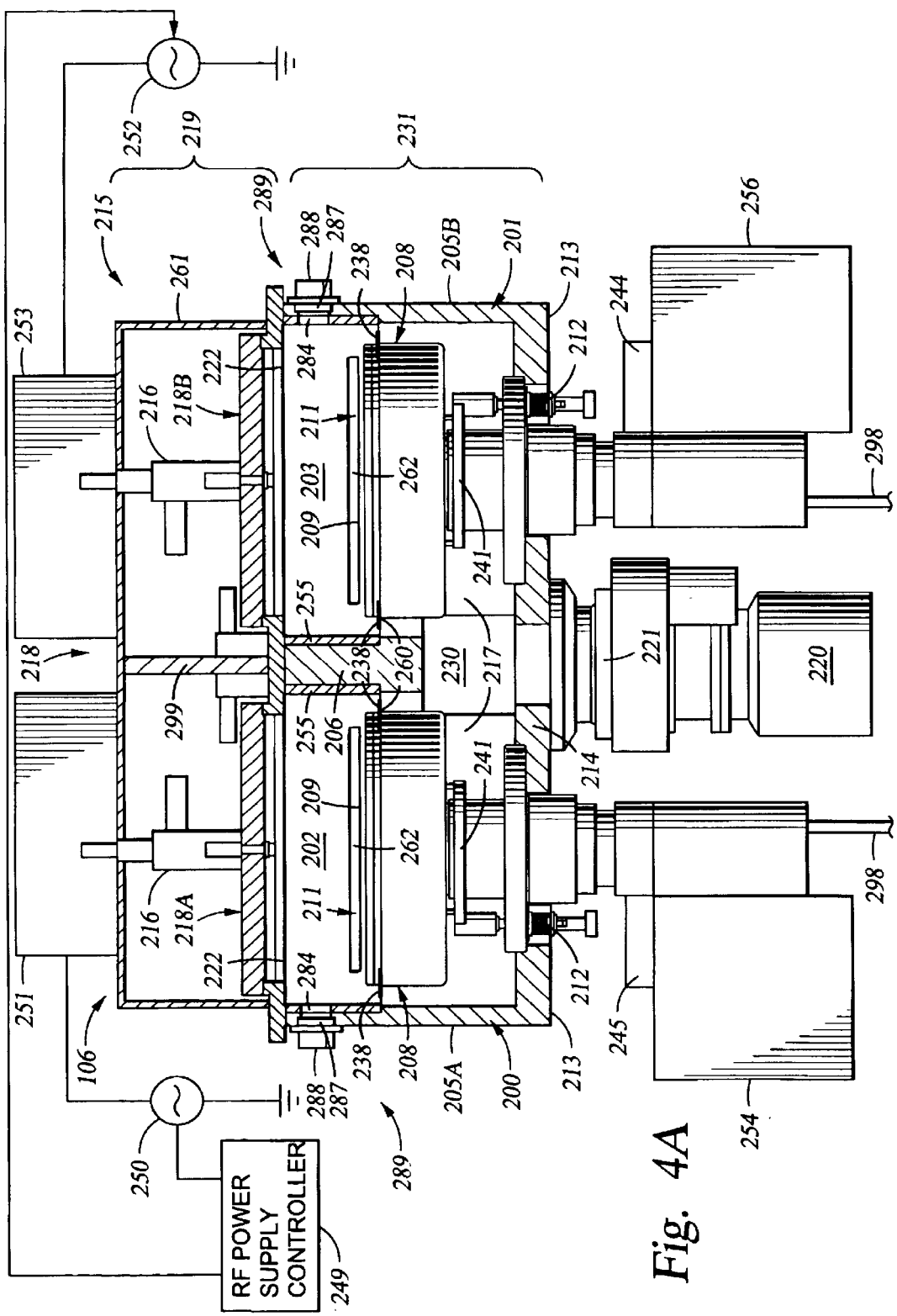
FIGS. 4A through 4D illustrate cross-sectional views of embodiments of the tandem etch chamber of FIG. 3.
Figure 5:
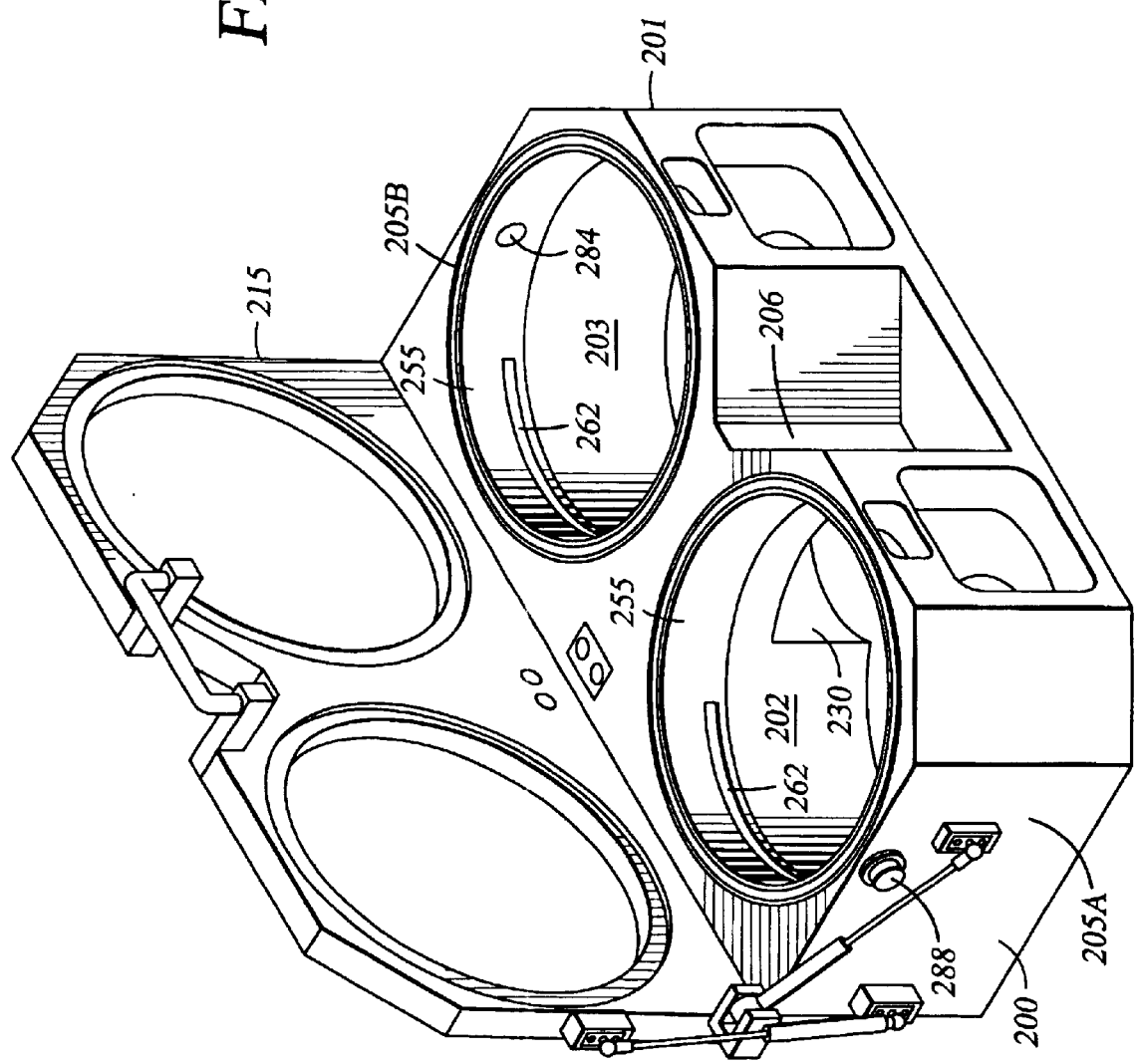
FIG. 5 is a perspective view of a portion of the tandem etch chamber of FIG. 3.

FIGS. 3 and 4A illustrate a front view and sectional views, respectively, of an exemplary tandem processing chamber 106 of the invention. Each of the respective first and second tandem process chambers 200, 201 may include an upper and lower portion 219, 231, wherein the upper portion 219 generally includes processing regions 202, 203 and wherein the lower portion 231 generally includes a loading region 211 adjacent an aperture 209. Each of the respective first and second tandem process chambers 200, 201 include sidewalls 205A,B, an interior wall 206, a bottom 213, and a lid 215 disposed thereon. The sidewall 205A, interior wall 206, and portion of lid 215 disposed on the first tandem processing chamber 200 define a first processing region 202. The sidewall 205B, interior wall 206 and portion of lid 215 disposed on the second tandem processing chamber 201 define a second processing region 203. The interior wall 206 is shared between the respective first and second tandem process chambers 200, 201 and isolates the processing environment of the processing regions 202, 203 from each other. As such, the processing regions 202, 203 defined in the respective chambers 200, 201 while process isolated, may share a common pressure, as the lower portion of interior wall 206 may allow the respective first and second tandem process chambers 200, 201 to communicate with each other. The lower portion of interior wall 206 is defined by a central pumping plenum 217 described below. The lid 215 may include one configuration of a gas distribution assembly 216 including a showerhead 222 configured to dispense a gas into the respective processing regions 202, 203. The lid 215 is generally attached to the processing chamber 106 using a hinge (not shown). The hinged lid 215 allows for convenient access to the chamber components such as the chamber liners 255 (See FIG. 5). A cover 261 may be disposed on the lid 215 to protect components disposed thereon.

As illustrated in FIGS. 4A–D and FIG. 5, to help decrease chamber servicing time, a removable chamber liner 255 may be disposed adjacent the sidewalls 205A,B and interior wall 206. The chamber liners 255 include an aperture 262 formed therein and in communication with the aperture 209. The apertures 262 and 209 are positioned as such to enable wafers to be moved into and out of the respective chambers 200, 201. As such, each of the apertures 209, 262 may generally be in selective communication with, for example, a wafer transfer chamber, such as chamber 104 illustrated in FIG. 1. Therefore, in order to maintain a processing environment within each of processing chambers 200, 201, a valve 210 of FIG. 1, such as a gate or slit valve, for example, may be positioned between each of the apertures 209 and the connecting chamber, or alternatively, a single valve may be implemented.

Referring to FIG. 4A, to provide process analysis, a window 287 may be disposed within each sidewall 205A,B and optically aligned with an opening 284 disposed within chamber liner 255. Each window 287 may be composed of any optically clear material adapted to withstand a process environment while providing an optical pathway for optical detectors 288 disposed adjacent each chamber 200, 201. The optical detectors 288 may be configured to optically receive and process optical signals from plasma within the respective processing regions 202, 203 and provide data representative of plasma to process controller 223 illustrated in FIG. 2.

Optical windows 287, optical detectors 289, and process controller 223 collectively form a process analysis system 289. During operation, optical signals may be processed by the process analysis system 289 to detect etching conditions for each chamber. To detect an etching process endpoint, a process endpoint measurement may be stored, for example, and compared by process controller 223 to a current measurement. Once the process analysis system 289 detects an optical signal from a processing chamber 200, 201, the process controller 223 may provide an endpoint indication to a user, for example.

Referring to FIG. 4A, to provide process analysis, a window 287 may be disposed within each sidewall 205A,B and optically aligned with an opening 284 disposed within chamber liner 255. Each window 287 may be composed of any optically clear material adapted to withstand a process environment while providing an optical pathway for optical detectors 288 disposed adjacent each chamber 200, 201. The optical detectors 288 may be configured to optically receive and process optical signals from plasma within the respective processing regions 202, 203 and provide data representative of plasma to process controller 223 illustrated in FIG. 2.

Optical windows 287, optical detectors 289, and process controller 223 collectively form a process analysis system 289. During operation, optical signals may be processed by the process analysis system 289 to detect etching conditions for each chamber. To detect an etching process endpoint, a process endpoint measurement may be stored, for example, and compared by process controller 223 to a current measurement. Once the process analysis system 289 detects an optical signal from a processing chamber 200, 201, the process controller 223 may provide an endpoint indication to a user, for example.

When the wafer supports 208 are in a processing position, the upper portion 219 of the respective first and second tandem process chambers 200, 201 and wafer supports 208 generally define the respective isolated processing regions 202, 203 to provide process isolation between each of the respective chambers 200, 201. Therefore, in combination, the sidewalls 205A,B, interior wall 206, wafer support 208, and the lid 215 provide process isolation between the processing regions 202, 203.

The volume of the processing regions 202, 203 and loading regions 211 may vary with the position of the wafer support 208 relative to the lower boundary of the lid 215. In one configuration, the wafer supports 208 may be lowered below the apertures 209. In this position, a wafer may be positioned on the wafer support 208 via the aperture 209 and the gate valve 210 (see FIG. 1). More particularly, when the wafer support 208 is lowered, the lift pin assembly 212 may operate lift pins 232 (See FIG. 8) to lift a wafer from the upper surface of the wafer support 208. Thereafter, a robot blade may enter into the loading region 211 and engage the wafer lifted by the lift pin assembly 212 for removal therefrom. Similarly, with the wafer support 208 in a lowered positioned, wafers may be placed thereon for processing. Thereafter, the wafer support 208 may be vertically moved into a processing position, i.e., a position where the upper surface of the wafer support 208 is positioned proximate to the respective processing region 202, 203.

Figure 4B:
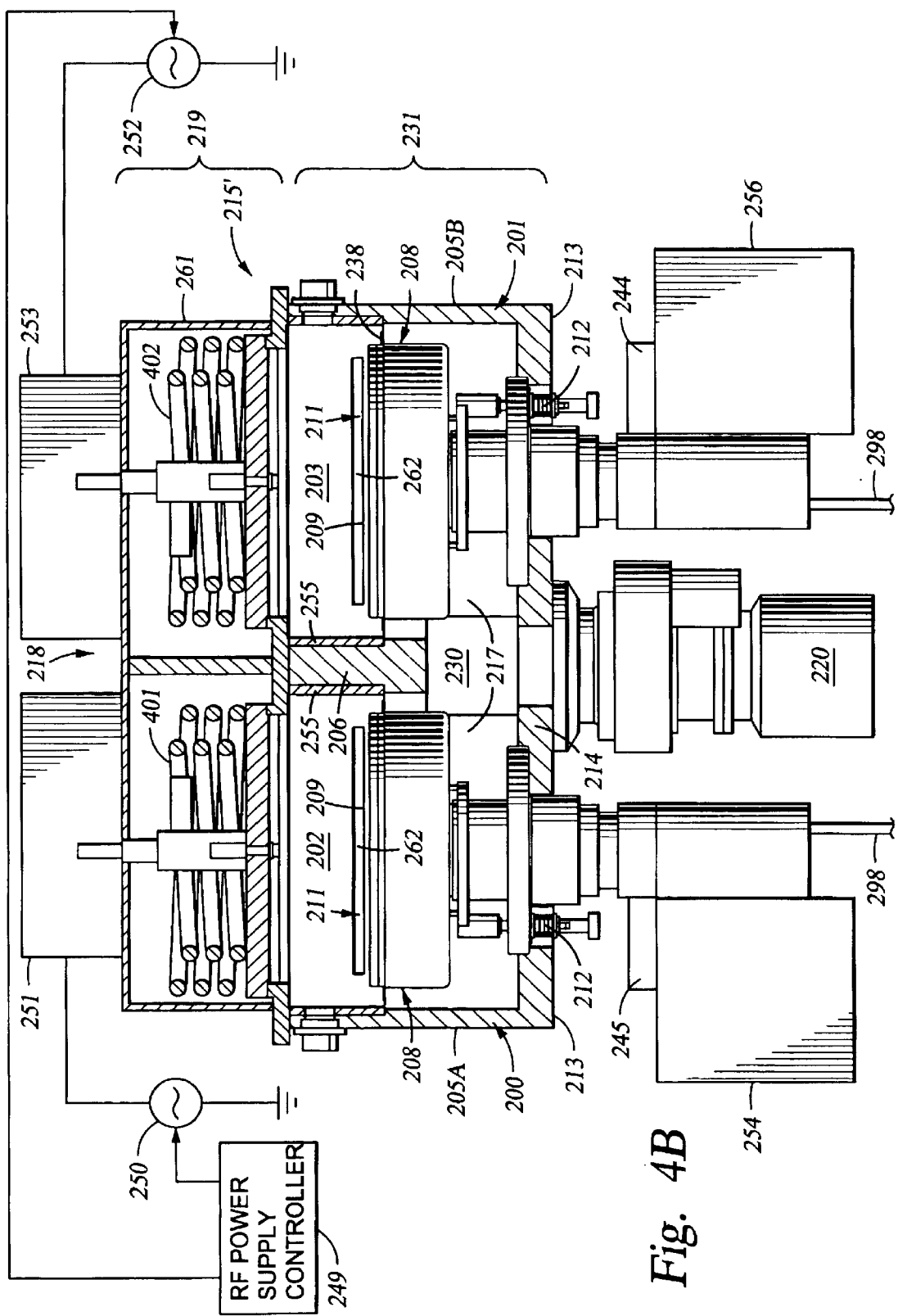
Figure 4C:
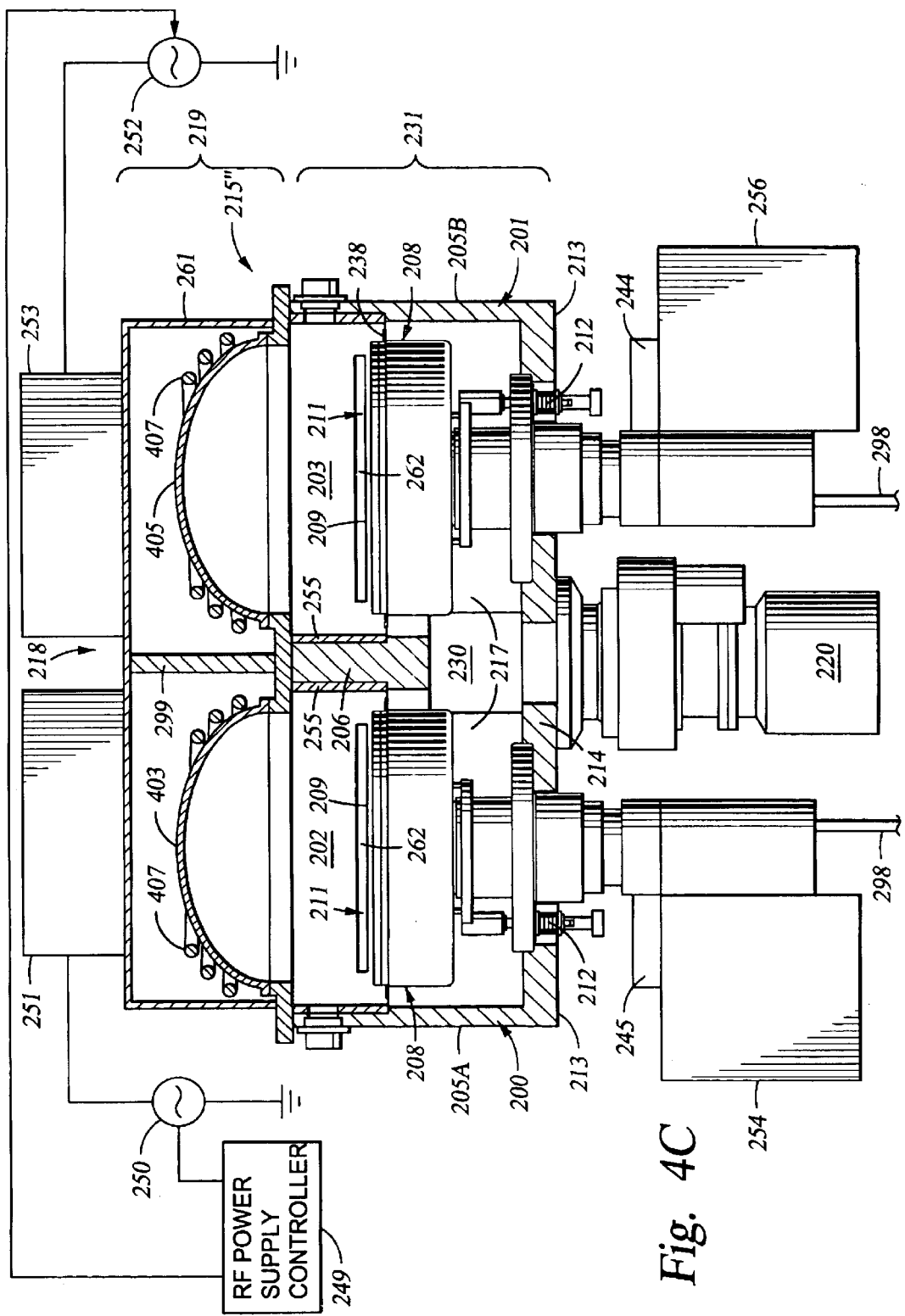
Figure 4D:
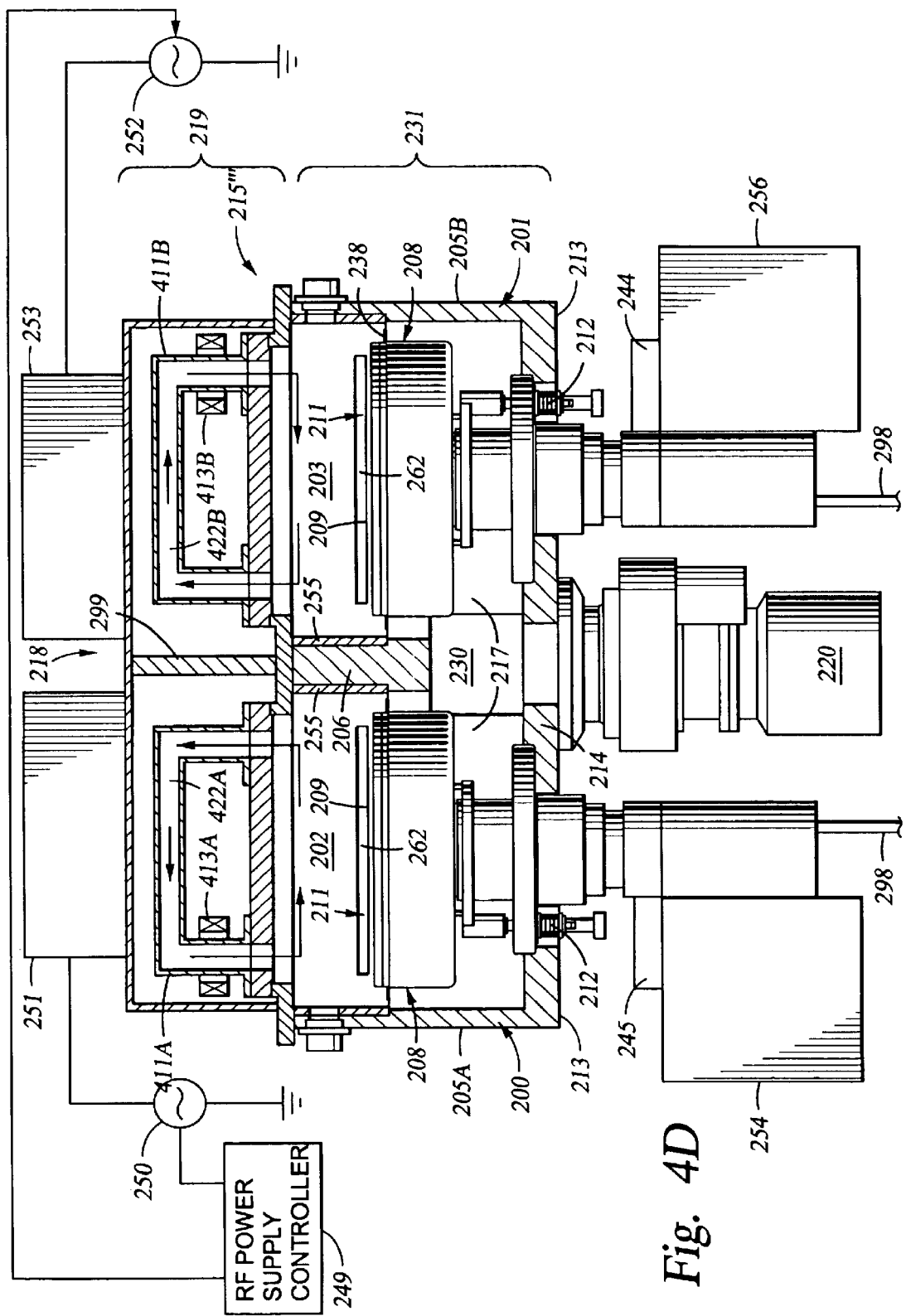

The lid 215 may have other plasma generation devices disposed adjacent thereto. The upper electrode assembly 218 may be configured with RF coils coupled to the first and second RF sources 250, 252 through respective matching networks 251, 253, to inductively couple RF energy into the plasma processing regions 202, 203. For example, FIG. 4B illustrates two concentric RF coils 401, 402 disposed above a lid 215'. Each RF coil 401, 402 may be coupled to the first and second RF sources 250, 252, respectively, and configured to generate plasma of process gases within each process region 202, 203. As illustrated in FIG. 4C, a lid 215" may include two quartz domes 403, 405 each having an RF coil 407 externally dispersed thereon. In this configuration, each quartz dome 403, 405 provides an upper boundary of each respective processing region 202, 203. Each RF coils 407 are coupled to the first and second RF sources 250, 252, respectively, and may be configured to generate plasma of process gases disposed within each respective process region 202, 203. In another illustrative embodiment, a lid 215''' may include two conduits 411A,B fluidly coupled to a respective processing region 202, 203 to receive process gas therein. The conduits 411 have one or more coils 413A,B coupled to the first and second RF sources 250, 252. The coils 413A,B are positioned such that each conduit 411A,B provides a closed loop toroidal plasma current path 422A and 422B to form plasma within the respective conduit 411A,B and processing region 202, 203. In each of FIGS. 4B, 4C, and 4D, the RF power supply controller 249 is coupled to both RF power supplies 250, 252 to provide output signal control including power level control, phase control (locking) and/or frequency control (locking).

Referring back to FIG. 4A, the lower portion 231 of the respective first and second tandem process chambers 200, 201 may also include a commonly shared adjacent chamber region of each chamber defined by a central pumping plenum 217, wherein the central pumping plenum 217 is in fluid communication with a common vacuum source 220 through a pumping valve 221. Generally, the central pumping plenum 217 includes two sections defined by the sidewalls 205A,B that are combined with an output port 230 in fluid communication with the pumping valve 221. The two sections may be formed as part of the lower portion 231 of each first and second tandem process chambers 200, 201. While the central pumping plenum 217 may be formed integral to the lower portion 231 of the first and second tandem process chambers 200, 201, it is contemplated that the central pumping plenum 217 may be a separate body coupled thereto. In a gas purge or vacuum process, the pumping valve 221 couples the vacuum source 220 to the output port 230 through mounting flange 214. Therefore, the central pumping plenum 217 is generally configured to maintain the respective chambers 200, 201, and more particularly, the respective processing regions 202, 203, at a pressure desired for semiconductor processing while allow for rapid removal of waste gases using a single vacuum source 220.

Figure 10A:
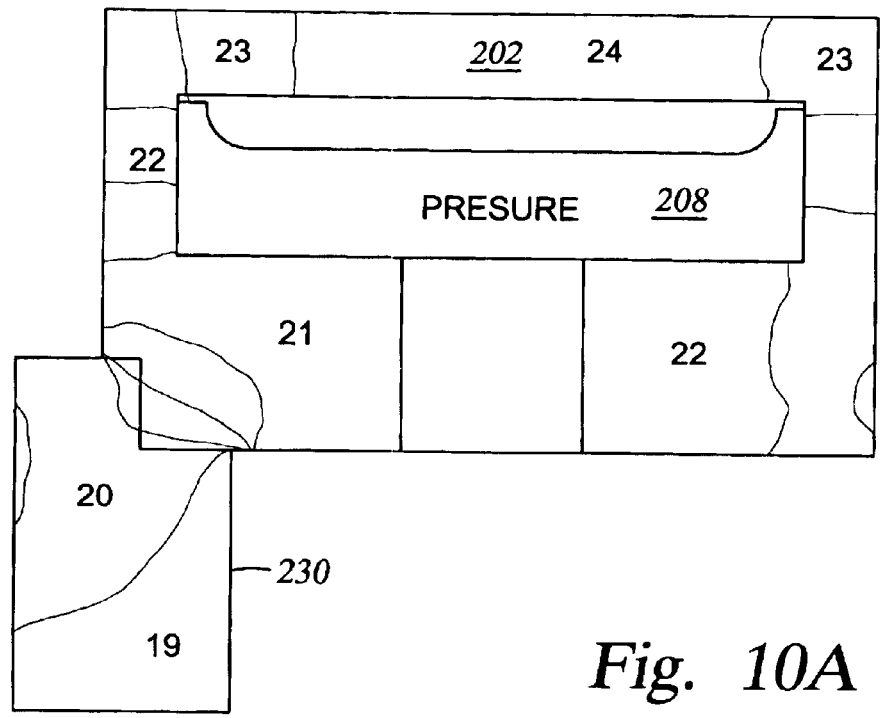
FIGS. 10A and 10B are simplified diagrammatic views illustrating gas flow and pressure during a pumping step through a plenum of a tandem etch chamber of FIG. 4.
Figure 10B:
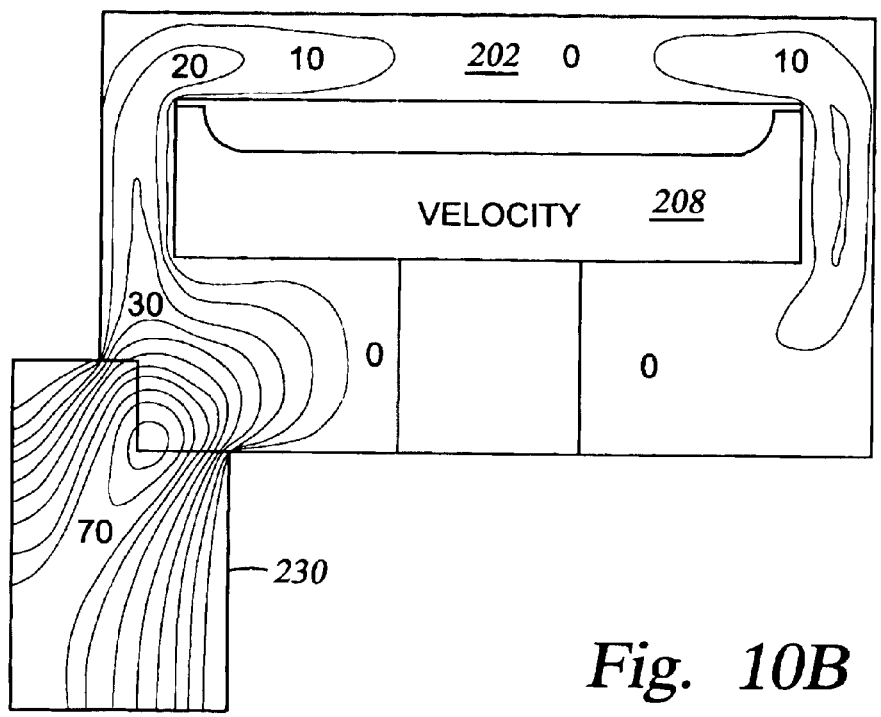

In one configuration, the output port 230 is positioned a distance from the processing regions 202, 203 such as to minimize RF energy therein, thereby minimizing striking a plasma in the exhaust gases being flushed from the processing chambers 201, 202. For example, the output port 230 may be positioned at a distance from the wafer supports 208 and processing regions 202, 203 that is sufficiently far to minimize RF energy within the output port 230. FIGS. 10A and 10B respectively illustrate an exemplar gas flow and gas pressure distribution of the processing regions 202, 203 and output port 230 for either tandem processing chambers 201, 202. For example, as illustrated in FIG. 10A, during a pumping step the pressure distribution is greatest within the processing region 202, and as illustrated in FIG. 10B, the velocity is the greatest near the output port 230 allowing the processing region 202 to be evacuated quickly.

Figure 8:
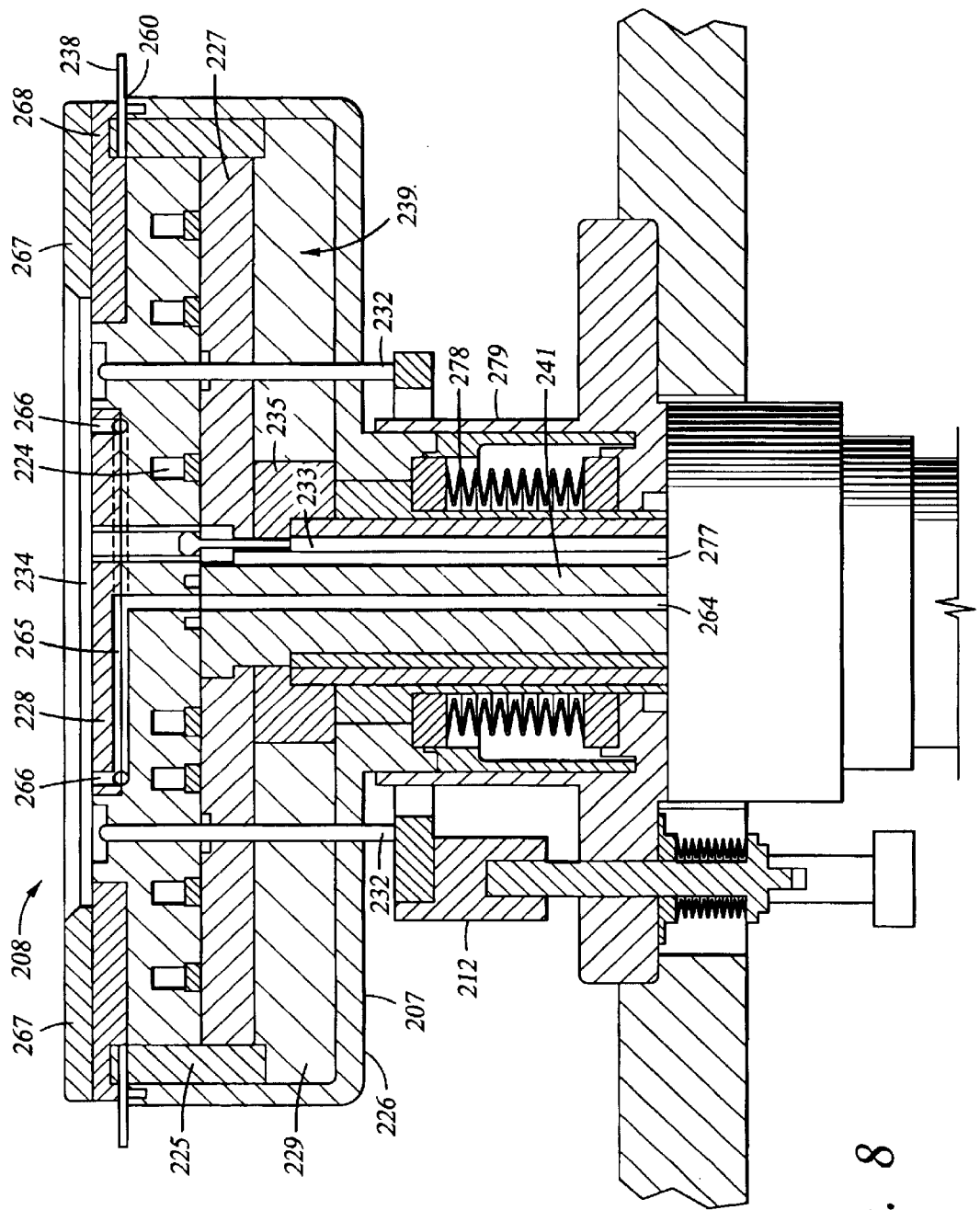
FIG. 8 is a sectional view of one of the wafer supports of FIG. 4.

FIG. 8 is a partial cross-section of the wafer support 208 of FIGS. 4A–D. FIGS. 4A–D are referenced as needed in the discussion of FIG. 8. As illustrated in FIG. 4A–D, the wafer supports 208 may be movable in a vertical direction, i.e., in the direction along the axis of the stem 241, and may be heated and/or cooled through, for example, fluid conduits formed therein or resistive heaters. The stem 241 may be isolated from the processing regions by a bellows 278. A shield member 279 may be disposed about the stem 241 and bellows 278 and may be used to isolate process gases from RF energy radiating from the stem 241 when biased. The wafer support 208 generally is formed with an outer wafer support shell 226 forming a cavity 239 therein. The shell 226 may be formed of materials such as stainless steel, aluminum, or other materials that are electrically conductive and adapted to withstand wafer processing. To electrically bias plasma toward and away from the wafer support 208, a first electrical bias source 254 and second electrical bias source 256 (see FIG. 4) may be coupled to a respective bias electrode 227 disposed within the cavity 239 via the stem 241. The bias electrode 227 may be supported from a bottom 207 of the wafer support 208 using a lower electrical bias insulator 229 and inner seal ring 235. The lower electrical bias insulator 229 and inner seal ring 235 may include dielectric materials such as quartz, and other insulators, sized to provide a low capacitance between the bottom 207 of the wafer support 208 and the bias electrode 227. A side electrical bias insulator 225 may be used to minimize RF coupling between the bias electrode 227 and the sidewalls 205A,B (see FIGS. 4A–D). The side electrical bias insulator 225 may include dielectric materials such as quartz, and other insulators, sized to provide a low capacitance between the bias electrode 227 and the sidewalls 205A,B.

The wafer support 208 includes an electrostatic chuck 234 to provide a stable working position for a wafer supported thereon. A first and second chuck power supplies 244, 245 (see FIGS. 4A–D) may be coupled to the electrostatic chuck 234 via a conduit 233, and may be used to produce an electrostatic field proximate the electrostatic chuck 234 to hold a wafer thereto. The first and second chuck power supplies 244, 245 may be DC supplies configured to provide an electrostatic field between the electrostatic chuck 234 and the wafer.

Inasmuch as heat is usually produced during wafer processing, a bias electrode coolant plate 228 may be disposed on the bias electrode 227 to remove heat therefrom. The bias electrode coolant plate 228 may be coupled to external coolant sources (not shown) using the lower coolant channel 277 disposed within the stem 241 coupled to a respective coolant line 298 (see FIGS. 4A–D). Coolant may be supplied within the bias electrode coolant plate 228 via upper coolant channels 224. To cool a wafer disposed on the electrostatic chuck 234 a gas coolant line 264 is coupled to a coolant gas dispersion assembly 265. The gas coolant dispersion assembly 265 is coupled to a plurality orifices 266 disposed through the electrostatic chuck 234. A gas, such as helium, is delivered through the gas coolant line 264 directly underneath the wafer through the orifices 266 to remove heat therefrom. To isolate the wafer support 208 from the processing environment, a top insulator 268 may be disposed on the electrode coolant plate 228 and abut the electrostatic chuck 234. To insulate the bias electrode coolant plate 228 from plasma, the top insulator 268 may include low dielectric materials such as quartz, and other insulators. To center a wafer on the electrostatic chuck 234, a centering ring 267 may be disposed on the top insulator 268. The centering ring 267 generally includes insulating materials to avoid conducting plasma to the wafer support 208, and may be configured with sloping internal edges to help the wafer self-center on the electrostatic chuck 234.

A skirt member 238 (i.e., plasma shield) may be disposed on an outer edge of the wafer support 208 and may extend, for example, from a slot 260 disposed radially about the wafer support 208. Accordingly, the skirt member 238 is adapted to slide up and down within the processing region 202, 203 in conjunction with the movement of respective wafer support 208 and adjacent the sidewalls 205A,B and interior wall 206 (see FIGS. 4A–D) or alternatively, the chamber liners 255. The skirt member 238 may be adapted to provide a variable plasma seal between the processing region and the lower region of the respective processing chamber 200, 201 while allowing waste gases to be pumped from the processing region. The skirt member 238 may include a plurality of apertures therein (e.g., holes, slots, etc.) adapted to allow the movement of process and waste gases between the processing regions 202, 203 and the lower region 231 while preventing plasma leakage therethrough.

Figure 6:
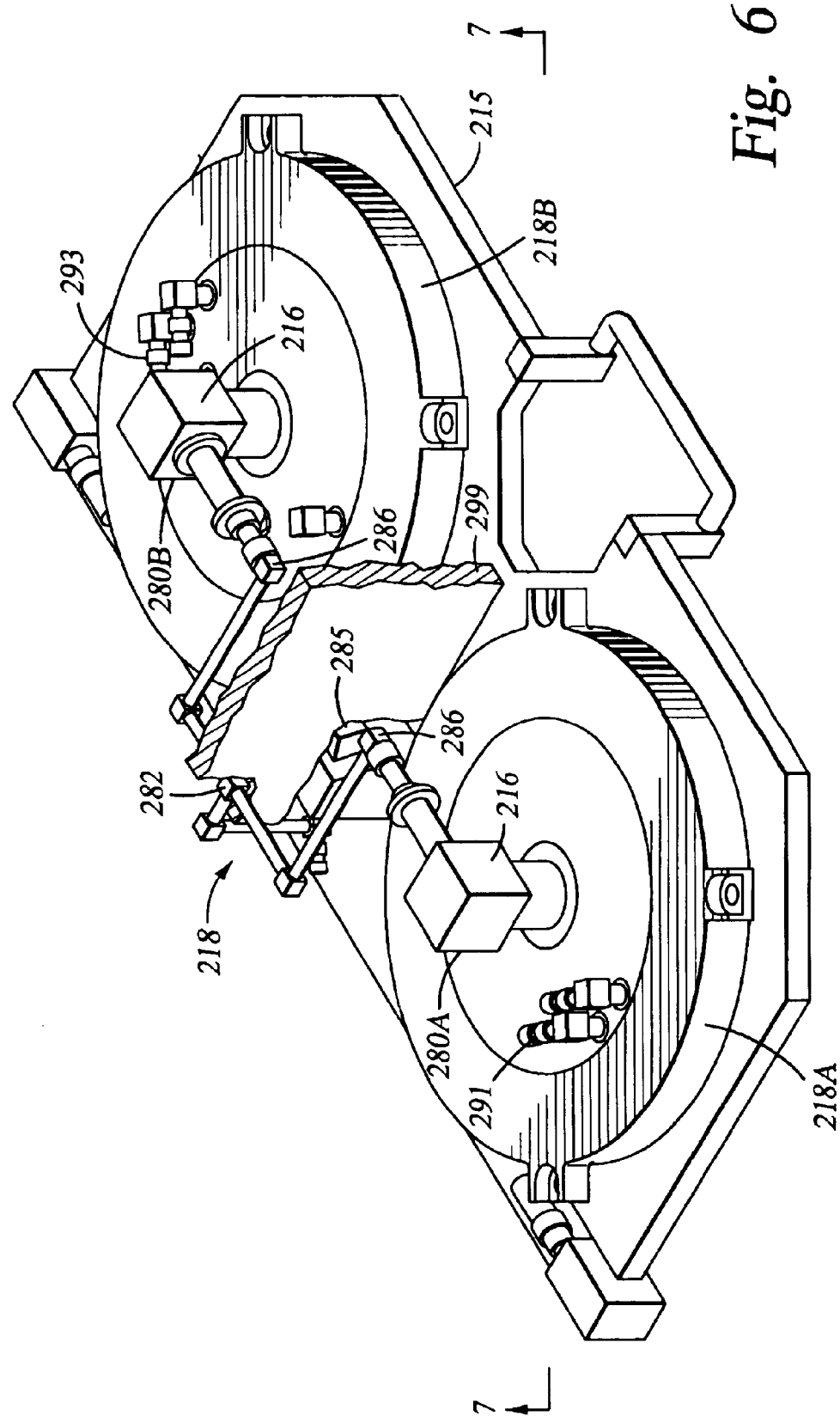
FIG. 6 is a perspective view of one embodiment of a lid including an electrode assembly.
Figure 7:
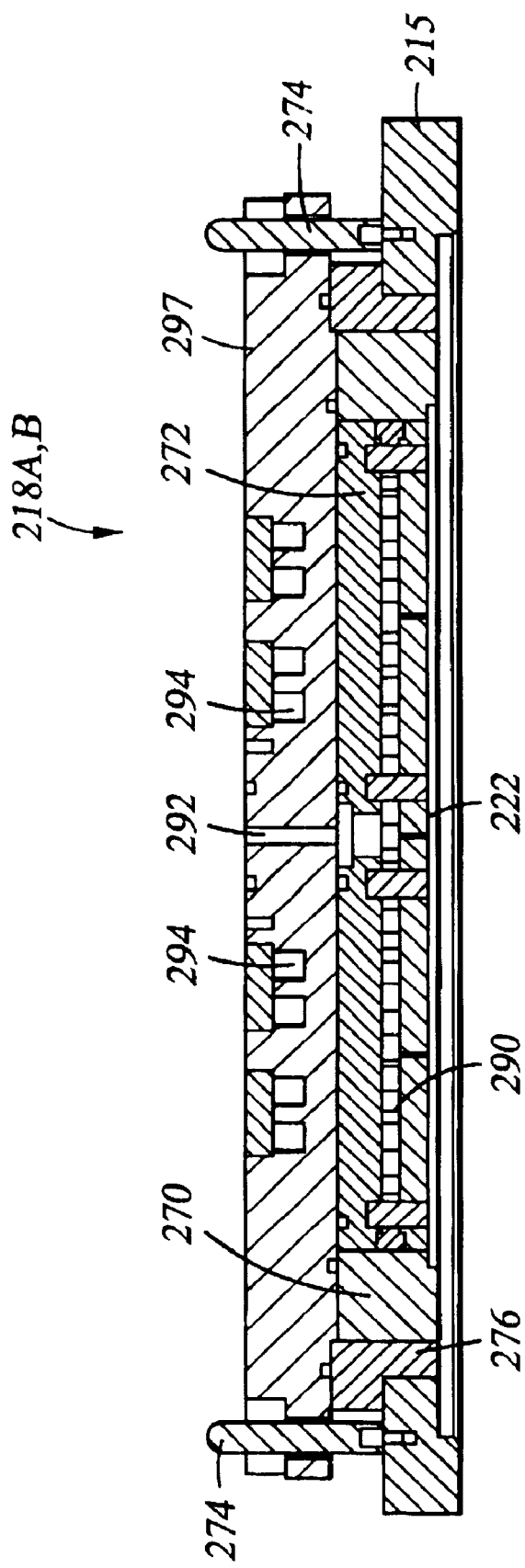
FIG. 7 is a cross-sectional view of an electrode assembly of FIG. 6.

FIGS. 6 and 7 are perspective and sectional views, respectively, of the lid 215 including an upper electrode assembly 218. The lid 215 and/or first and second tandem processing chambers 200, 201 may include cooling passages (not shown) that circulate coolant received from an upper coolant input/output port 285. As illustrated in FIG. 6, the upper electrode assembly 218 includes a first upper electrode assembly 218A and a second electrode assembly 218B disposed adjacent the processing regions and adapted to provide RF energy to respective processing regions 202, 203 (See FIG. 4A). To provide thermal control to the upper electrode assembly 218, cooling channels 294 for the first and second upper electrode assemblies 218A and 218B may be coupled to an external coolant source (not shown) by a first and second coolant input 291 and 293, respectively.

The upper electrode assembly 218 may include an RF shield 299 mounted between the first and second upper electrode assemblies 218A and 218B to minimize RF leakage by isolating electromagnetic fields therebetween. The RF shield 299 may include materials adapted to absorb or reflect RF energy. For example, RF shield 299 may include metals such as steel and aluminum, and may also include electromagnetic insulating materials. The RF shield 299 may be configured to span the width of the lid 215 and may extend to the top of the cover 261 as illustrated in FIG. 4A. To provide additional RF isolation, the shield member 299 may include an RF gasket (not shown) disposed between the shield member 299 and the lid 215.

As illustrated in FIG. 6, a gas splitter assembly 282 may be used to couple process gas supplies (not shown) to the gas distribution assembly 216. The gas splitter assembly 282 may include resistive elements 286 coupled to a respective first and second gas inlets 280A, 280B. The resistive elements 286 are adapted to provide a resistance to gas flow from the gas splitter 282, such that about equal amounts of gas flow into the processing regions 202, 203 through the gas distribution assemblies 216. As illustrated in FIG. 7, the gas distribution assembly 216 comprises a gas inlet 292 that couples gas from process gas supplies (not shown) to the showerhead 222 through the upper electrode assembly 218A,B.

Figure 9:
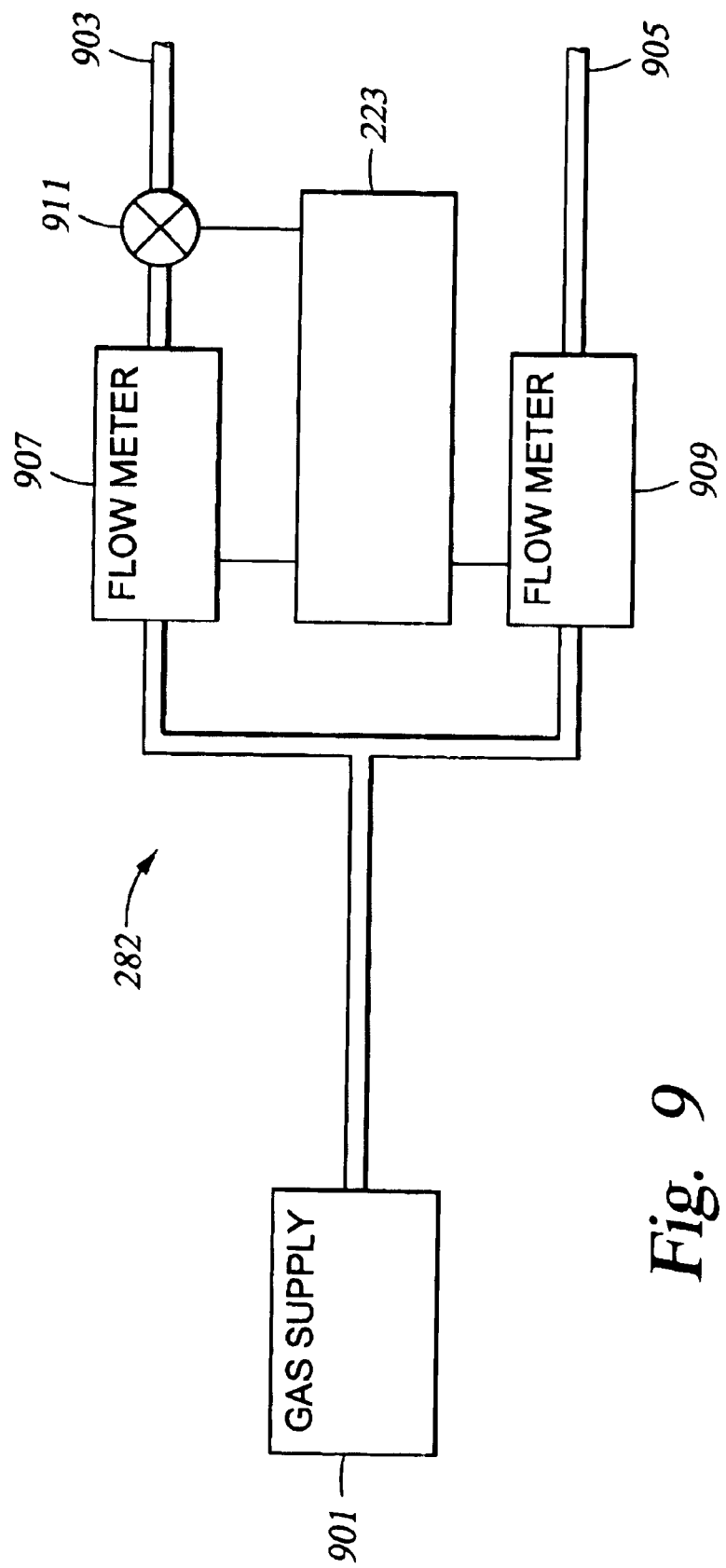
FIG. 9 is a simplified schematic diagram of one embodiment of a gas splitter assembly.

A gas flow measuring devices such as a mass flow meter and gas flow controllers may be used in conjunction with, or separate from, the resistive elements 286, wherein the gas flow measuring devices and gas flow controllers are coupled to the process controller 223 (see FIG. 3) to control the amount of gas flow to each processing region 202, 203 through the gas distribution assemblies 216. For example, FIG. 9 illustrates one configuration of the gas splitter assembly 282. As illustrated, a gas supply 901 such as a gas panel couples one or more gases to a gas path 903 and gas path 905. Gas path 903 may include a mass flow meter 907 (MFM). In one configuration, the MFM 907 may be coupled to a resistive element (e.g., a variable orifice 911) configured to adjust the flow of both gas path 903 and 905. A MFM 909 may be coupled to gas path 905 measures the flow of gas therethrough. The MFM 907, MFM 909, and variable orifice 911 may be coupled to process controller 223 to control the gas flow within gas paths 903 and 905.

With reference to FIG. 7, the first and second upper electrode assemblies 218A,B may be electrically insulated from the lid assembly 215 using an outer insulator ring 276 and inner insulator ring 270. The outer and inner insulator rings 276, 270 may be fabricated of materials that include ceramics, glass, and other insulators adapted to provide electrical insulation. Each of the first and second upper electrode assemblies 218A,B may include an upper electrode 272 adapted to provide RF energy between the respective processing region 202, 203 disposed between the showerhead 222 and the wafer support 208. A plurality of support pins 290 may be disposed between the upper electrode 272 and the showerhead 222 to minimize heat transfer therebetween. The first and second upper electrode assemblies 218A,B may also include a cooling plate 297 having a plurality of cooling channels 294 disposed therein. The cooling plate 297 may be coupled to the upper electrode 272 to draw heat therefrom. In one embodiment, the upper electrode 272 is held to thermal range of less than about +/−5 degrees Celsius by measuring the temperature of the cooling fluid and/or the cooling plate 297 and increasing/decreasing the thermal absorption of the cooling plate 297 accordingly. A plurality of guide pins 274 (two are shown) may be used to allow the upper electrode assembly 218 and gas distribution assembly 216 to be removed from the outer and inner insulating rings 276, 270 and lid 215 for servicing while providing a guide for reassembly.

In operation, embodiments of the invention generally provide a processing system configured to conduct wafer processing on at least two semiconductor wafers simultaneously. The processes that can be performed in the inventive system include material deposition, etching, plasma treatment, thermal treatment and the like. More particularly, using the exemplary embodiment of the invention illustrated in FIG. 1 as an example, wafers to be processed may be placed into wafer processing system 100 from cassettes 109.

Then wafers, generally two, may be transported into loadlock chamber 112 via transfer robots 113, and the loadlock chamber 112 may be sealed from the chamber containing cassettes 109, through, for example, a selectively actuated gate valve 210 positioned between the respective chambers. Thereafter, the loadlock chamber 112 may be brought to a predetermined pressure and opened up to the wafer transfer chamber 104. Once the first and second tandem process chambers 200, 201 are in fluid communication with each other, the two wafers in the loadlock chamber 112 may be simultaneously transported into the wafer transfer chamber 104 via the wafer transfer robot 105, which generally includes a robot blade configured to simultaneously support two wafers. The two wafers are generally supported in a side-by-side configuration in the same horizontal plane by the robot blade. A pair of the gate valves 210 positioned between the transfer chamber 104 and the processing chamber 106 may be opened and the two wafers may be inserted into a processing chamber 106, wherein wafer processing may be conducted thereon.

Once the robot blade is inserted into the processing chamber 106, the wafers may be simultaneously placed into the respective tandem chambers 200, 201. The receiving process for the respective first and second tandem process chambers 200, 201 generally includes, for example, lowering of the respective wafer supports 208 adjacent the loading region 211 into a loading position. The loading position may be where the wafer supports 208 engage a lift pin assembly 212, and are generally positioned below a plane through which the robot blade may enter into the respective chambers via gate valve 210 and entrance aperture 209. Thus, the robot blade may deposit the wafers into the respective chambers 200, 201 by positioning the wafers onto the lift pin assemblies 208. Once the wafers are positioned on the lift pin assemblies 212, the robot blade may be retracted from the respective chambers 200, 201 and the gate valves 210 may be closed to seal the chambers 200, 201 from the transfer chamber 104.

Once the loading process is complete, the respective wafer supports 208 may be moved from a loading position to a wafer processing position. The transition from the loading position to the wafer processing position generally includes raising the wafer support vertically within the respective chambers 200, 201, such that the distance from the upper surface of the wafer support 208 to the lower surface of the showerhead 222 is set to a desired distance. For example, the distance may be about one inch to about three and one half inches. This movement of the wafer support 208 also operates to define the volume of the respective processing regions 202, 203 within chambers 200, 201, as the upper surface of the wafer support 208 defines the lower boundary of the respective processing regions 202, 203. Additionally, the lift pin assemblies 212 raise and lower the wafers onto the upper surfaces of the respective wafer supports 208 as the wafer supports 208 disengage with the portion of lift pin assembly 212 positioned in the lower portion 231 of the respective chambers. Further, the process of bringing the respective wafer supports 208 into the processing position may further include bringing the respective chambers to a processing pressure, which generally includes evacuating ambient gases from the respective chambers via the aforementioned vacuum pump 220.

Once the respective wafers are loaded, moved into the processing position, and the pressure in the respective chambers 200, 201 is brought to a desired processing pressure, a plasma may be generated within both of the respective processing regions 202, 203. Plasma may be generated by introducing a process gas via showerhead 222, adjusting the pumping valve 221 to pump the gas into the respective chambers 200, 201 at a desired pressure then igniting the gas with RF energy. More particularly, plasma may be generated by application of RF power to the first and second upper electrode assemblies 218A,B, which then generates plasma from a process gas introduced into the respective processing region 202, 203.

In one operation embodiment of generating plasma, the chamber pressure may be between about 20 milli Torr and about 2 Torr. A process gas such as $CF_4$, $C_4F_8$, $C_4F_6$, $C_8F_4$, $CHF_3$, $Cl_2$, HBr, $NF_3$, $N_2$, Ar, He, $O_2$ and/or combinations thereof are introduced into each of the first and second tandem process chambers 200, 201 at rates of between about 200 sccm to about 1000 sccm. The upper electrode assembly 218A,B is biased to between about 20 Watts and about 1000 Watts, relative the chamber ground at about 40 MHz to about 200 MHz. Ground for the upper electrode assembly 218A,B is the sidewalls 205A,B and interior wall 206 and bias electrode 227. The bias electrode 227 is biased to about between 50 and 5000 watts at between about 2 MHz to about 13.56 MHz. Ground for the bias electrode 227 is the sidewalls 205A,B, and interior wall 206, and upper electrode assembly 218A,B. While the above parameters may be used to, for example, etch wafer having polysilicon, oxides, metals, and the like, other gases and power settings are contemplated for other processes not mentioned herein.

As the plasma leakage from the processing region may be minimized using the skirt member 238, the plasma density may be adjusted to provide a higher uniformity than conventional systems. Further, as the RF leakage is minimized using the interior wall 206 and RF shield 299, the RF power levels may be adjusted to maximize throughput while minimizing RF cross-talk between the tandem processing chambers 200, 201. Therefore, as the processing regions are environmentally and electro-magnetically isolated, combinations of system settings may be used to provide a high throughput and greater process uniformity than conventional systems. For example, the wafer supports 208 may be independently moved closer to, or further from, the respective showerheads 222, the output power levels of the RF sources 250, 251 and the electrical bias of the wafer support 208 may be independently adjusted for each chamber 201, 202 to provide a uniform plasma density therein of about $1 \times 10^9$ and $1 \times 10^{10}$ ions. While the inventors have demonstrated that configurable chamber values of the invention may provide etch rates over 10,000 angstroms per minute and uniformities of less than about 2% for 200 millimeter and 300 millimeter wafers, other wafer sizes and etching rates are contemplated. In addition, while the inventors have demonstrated that that configurable chamber values of the invention may provide process uniformity differentials between two concurrently processed wafers of about less than 2.5% other lower values are contemplated.

The operation of the plasma process may be monitored by the process analysis system 289 described above with respect to FIGS. 4A–D to determine when each process chamber 200, 201 has reached an endpoint value and is complete. Once the individual processing recipe step is completed, plasma generation may be terminated and the individual wafers may be removed from the respective processing chambers 200, 201. The unloading process generally includes lowering of the wafer support 208 from the processing position to the wafer loading/unloading position. Once the wafer support 208 is in the loading/unloading position, valves 210 may be opened in order to allow the robot blade to access the respective processing chamber 200, 201 and remove the processed wafers therefrom. Once the wafers are removed, they may be transferred to another set of tandem processing chambers 106 so that another processing recipe step may be conducted thereon. Similarly, two additional wafers may be brought into the processing chambers where the two wafers were just removed therefrom so that a processing step may be conducted thereon. As such, the exemplary configurations of the invention, which are generally illustrated in FIGS. 1–8 allows for the simultaneous processing of two wafers in the tandem processing chambers 200, 201.

While the foregoing is directed to embodiments of the invention, other and further embodiments of the invention may be devised without departing from the basic scope thereof, and the scope thereof is determined by the claims that follow.

What is claimed is:

1. An apparatus for processing a wafer, comprising:
   a chamber defining a plurality of isolated processing regions, each having an upper end and a lower end;
   a plurality of plasma generation devices, each being disposed adjacent the upper end of one isolated processing region;
   a plurality of RF power supplies, each being connected to one plasma generation device, wherein the output signals of the RF power supplies are locked together by at least one of a phase lock and a frequency lock;
   a plurality of gas distribution assemblies, each being coupled to one plasma generation device and disposed within one isolated processing region; and
   a plurality of movable wafer supports, each being disposed within one isolated processing region, wherein each movable wafer support includes a bias electrode coupled to a bias power supply.

2. The apparatus of claim 1, further comprising an RF shield member positioned between a first plasma generation device disposed adjacent a first isolated processing region and a second plasma generation device disposed adjacent a second isolated processing region, the RF shield member being configured to electro-magnetically isolate the first plasma generation device from the second plasma generation device.

3. An apparatus for processing a wafer, comprising:
   a chamber defining a plurality of isolated processing regions, each having an upper end and a lower end;
   a plurality of plasma generation devices, each being disposed adjacent the upper end of one isolated processing region;
   a plurality of RF power supplies, each being connected to one plasma generation device, wherein the output signals of the RF power supplies are locked together;
   a plurality of gas distribution assemblies, each being coupled to one plasma generation device and disposed within one isolated processing region;
   a plurality of movable wafer supports, each being disposed within one isolated processing region, wherein each movable wafer support includes a bias electrode coupled to a bias power supply; and
   an RF power supply controller coupled to the plurality of RF power supplies, wherein the RF power supply controller is configured to lock the output frequency of each of the RF power supplies using at least one of a phase lock and a frequency lock.

4. The apparatus of claim 1, wherein the movable wafer support comprises an outer shell and an insulator disposed thereon to support the bias electrode.

5. The apparatus of claim 1, wherein the plasma generation device includes a thermal cooling plate adapted to remove heat therefrom.

6. The apparatus of claim 5, wherein the thermal cooling plate is adapted to maintain the temperature of the plasma generation device to about +/−5 degrees Celsius.

7. The apparatus of claim 1, wherein the plurality of isolated processing regions are connected by a common vacuum source.

8. The apparatus of claim 7, wherein the isolated processing regions are connected to a plenum adapted to equalize chamber pressure between the plurality of isolated processing regions.

9. The apparatus of claim 1, further comprising a skirt member coupled to the movable wafer support.

10. The apparatus of claim 9, wherein the skirt member is adapted to move in conjunction with the movable wafer support to form a plasma barrier between the upper end and lower end of the isolated processing region.

11. The apparatus of claim 9, wherein the skirt member includes a plurality of apertures to allow process gasses to flow therethrough.

12. The apparatus of claim 1, further comprising a gas flow splitting apparatus adapted to split the flow of one or more process gasses about equally between each isolated processing region.

13. The apparatus of claim 12, wherein the gas flow splitting apparatus comprises at least one restive element adapted to provide an about equal gas flow to each of the plurality of isolated processing regions.

14. The apparatus of claim 12, wherein the gas flow splitting apparatus comprises at least one gas flow controller adapted to provide an about equal gas flow to each of the plurality of isolated processing regions.

15. The apparatus of claim 14, wherein the gas flow splitting apparatus comprises a gas flow meter, wherein the gas flow controller is fluidly coupled to a first gas path, wherein the gas flow meter and the gas flow controller are configured to control the gas flow between each of the plurality of isolated processing region.

16. The apparatus of claim 1, further comprising a process analysis system.

17. The apparatus of claim 16, wherein the process analysis system comprises an optical detector optically coupled to each processing region to receive optical signals therefrom.

18. The apparatus of claim 1 wherein each of the plasma generation devices comprises at least one of an electrode, a coil, and a toroidal plasma generation conduit.

19. A tandem etching chamber, comprising:
a first tandem processing chamber defining a first processing region, comprising:
a first movable wafer support positioned in the first tandem processing chamber; and
a first gas distribution assembly disposed at an upper end of the first processing region;
a second tandem processing chamber positioned adjacent the first tandem processing chamber, the second tandem processing chamber defining a second processing region that is isolated therefrom by a shared interior wall, the second tandem processing chamber comprising:
a second movable wafer support positioned in the second tandem chamber;
a second gas distribution assembly disposed at an upper end of the second processing region; and
a pumping apparatus cooperatively in fluid communication with the first and second tandem processing chambers;

a first plasma generation device in communication with the first tandem processing chamber and a second plasma generation device in communication with the second tandem processing chamber, wherein a first signal driving the first plasma generation device is frequency or phase locked with a second signal driving the second plasma generation device;
an RF shield member positioned between the first and second plasma generation devices; and
a gas splitting apparatus coupled to the first and second gas distribution assemblies, wherein the gas splitting apparatus is adapted to about evenly divide an input gas flow between the first and second gas distribution assemblies.

20. The tandem chamber of claim 19, further comprising a first electrical bias source coupled to the first movable wafer support.

21. The tandem chamber of claim 19, further comprising a second electrical bias source coupled to the second movable wafer support.

22. The tandem chamber of claim 19, wherein the first and second plasma generation devices comprise a first and second RF source.

23. The tandem chamber of claim 19, further comprising a first skirt member coupled to the first movable wafer support and a second skirt member coupled to the second movable wafer support.

24. The tandem chamber of claim 23, wherein each of the first and second skirt members provide a plasma shield between respective first and second processing regions and a respective adjacent portion in fluid communication with the first and second tandem processing chambers.

25. The tandem chamber of claim 19, wherein the shared interior wall separates an upper portion of the respective first and second tandem processing chambers, while allowing an adjacent portion of the respective first and second tandem processing chambers to be in fluid communication with each other.

26. The tandem chamber of claim 25, wherein the adjacent portion is defined by a plenum positioned with respect to the first and second plasma generation devices to minimize plasma generation within the adjacent portion.

27. The tandem chamber of claim 19, wherein the first and second plasma generation devices comprise at least one of an electrode, a coil, and a toroidal plasma generation circuit.

28. An etch processing system, comprising:
a loadlock chamber;
a wafer transfer chamber selectively in communication with the loadlock chamber; and
at least one tandem etch processing chamber selectively in communication with the wafer transfer chamber, the tandem etch chamber comprising:
a first and second adjacently positioned processing chambers;
a first and second gas distribution assembly in fluid communication with the first and second processing chambers, respectively;
a first plasma generation device in communication with the first adjacently positioned processing chamber and a second plasma generation device in communication with the second adjacently positioned processing chamber, wherein a first signal driving the first plasma generation device is frequency or phase locked to a second signal driving the second plasma generation device, and wherein the first and second adjacently positioned processing chambers share a common wall that process separates the respective processing chambers while allowing fluid communication therebetween; and a gas splitting apparatus coupled to the first and second gas distribution assemblies, wherein the gas splitting apparatus is adapted to about evenly divide an input gas flow between the first and second gas distribution assemblies.

29. The system of claim 28, wherein the wafer transfer chamber includes a wafer transfer robot positioned therein, the wafer transfer robot being configured to transfer wafers two at a time between the at least one tandem etch processing chamber and the loadlock chamber.

30. The system of claim 28, further comprising a centrally located pumping aperture in communication with a vacuum pump, the centrally located pumping aperture being configured to simultaneously pump both the first and second adjacently positioned processing chambers to an equal pressure.

31. The system of claim 28, wherein a lower portion of the first and second adjacently positioned processing chambers includes a selectively actuated valve configured to communicate wafers therethrough into the lower portion of the first and second adjacently positioned processing chambers.

32. The system of claim 28, wherein the first and second adjacently positioned processing chambers each comprise a selectively actuated wafer support configured to move between a processing position and a loading position, wherein the loading position corresponds to a position in a lower portion of the respective processing chamber adjacent an aperture configured to communicate wafers into and out of the processing chamber, and wherein the processing position corresponds to a position in an upper portion of the respective processing chamber adjacent the respective gas distribution assembly.

33. The system of claim 32, further comprising a skirt member slidably disposed within each of the processing chambers and coupled to the selectively actuated wafer support, wherein the selectively actuated wafer support; gas distribution assembly, and skirt member form a variable volume plasma processing region therein.

34. The system of claim 33, wherein each skirt member provides a plasma shield between the variable volume plasma processing region and a respective adjacent region in fluid communication with the first and second adjacently positioned processing chambers.

35. The system of claim 28, wherein the first and second plasma generation devices comprise at least one of an electrode, a coil, and a toroidal plasma generation conduit.

* * * * *